United States Patent
Sawa et al.

(10) Patent No.: US 9,892,930 B1
(45) Date of Patent: Feb. 13, 2018

(54) SEMICONDUCTOR MEMORY DEVICE AND METHOD FOR MANUFACTURING SAME

(71) Applicant: Toshiba Memory Corporation, Minato-ku (JP)

(72) Inventors: Keiichi Sawa, Yokkaichi (JP); Shinji Mori, Yokkaichi (JP); Masayuki Tanaka, Yokkaichi (JP); Katsuyuki Kitamoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/412,396

(22) Filed: Jan. 23, 2017

Related U.S. Application Data

(60) Provisional application No. 62/397,089, filed on Sep. 20, 2016.

(51) Int. Cl.

| | |
|---|---|
| *H01L 27/115* | (2017.01) |
| *H01L 21/28* | (2006.01) |
| *H01L 27/1157* | (2017.01) |
| *H01L 27/11582* | (2017.01) |
| *H01L 23/522* | (2006.01) |
| *H01L 23/528* | (2006.01) |

(52) U.S. Cl.
CPC ...... *H01L 21/28282* (2013.01); *H01L 23/528* (2013.01); *H01L 23/5226* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| 8,247,857 B2 | 8/2012 | Ozawa et al. | |
|---|---|---|---|
| 9,443,861 B1 * | 9/2016 | Pachamuthu | H01L 27/11524 |
| 9,711,530 B1 * | 7/2017 | Ikawa | H01L 27/11582 |
| 9,716,105 B1 * | 7/2017 | Tsutsumi | H01L 21/02326 |
| 2010/0006923 A1 * | 1/2010 | Fujitsuka | H01L 21/28282 |
| | | | 257/324 |
| 2010/0148237 A1 | 6/2010 | Kito et al. | |

(Continued)

FOREIGN PATENT DOCUMENTS

| JP | 2010-147125 | 7/2010 |
|---|---|---|
| JP | 5230274 | 7/2013 |

(Continued)

*Primary Examiner* — Jarrett Stark
(74) *Attorney, Agent, or Firm* — Oblon, McClelland, Maier & Neustadt, L.L.P.

(57) ABSTRACT

A semiconductor memory device includes a first electrode layer; a second electrode layer provided above the first electrode layer; a first insulating oxide layer provided between the first and second electrode layers; a semiconductor layer extending through the first electrode layer, the first insulating oxide layer and the second electrode layer that are stacked in the first direction; and a second insulating oxide layer extending in the first direction between the semiconductor layer and the first insulating oxide layer, the second insulating oxide layer being in contact with the first insulating oxide layer. At least one of the first insulating oxide layer and the second insulating oxide layer includes nitrogen atoms. The nitrogen atoms are distributed around an interface between the first insulating oxide layer and the second insulating oxide layer, or distributed in the vicinity of the interface.

18 Claims, 13 Drawing Sheets

(56) References Cited

U.S. PATENT DOCUMENTS

| | | |
|---|---|---|
| 2012/0273863 A1 | 11/2012 | Ozawa et al. |
| 2013/0109157 A1 | 5/2013 | Kito et al. |
| 2015/0263034 A1* | 9/2015 | Higuchi ............ H01L 27/11582 257/324 |
| 2015/0263126 A1 | 9/2015 | Shingu et al. |
| 2017/0256562 A1* | 9/2017 | Sonoda ............. H01L 27/11582 |
| 2017/0278859 A1* | 9/2017 | Sharangpani ..... H01L 27/11573 |

FOREIGN PATENT DOCUMENTS

| | | |
|---|---|---|
| JP | 2015-177118 | 10/2015 |
| JP | 2015-177129 | 10/2015 |

\* cited by examiner

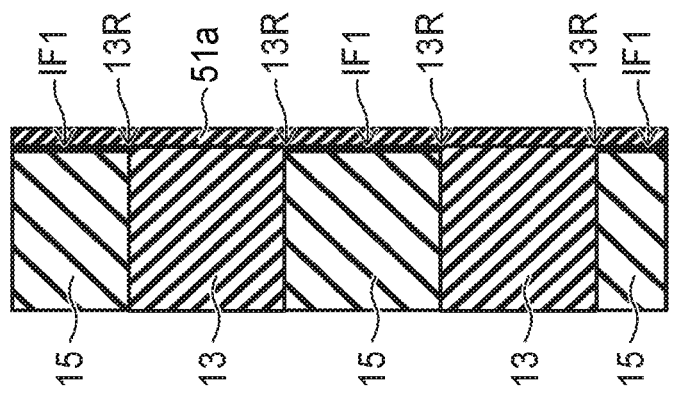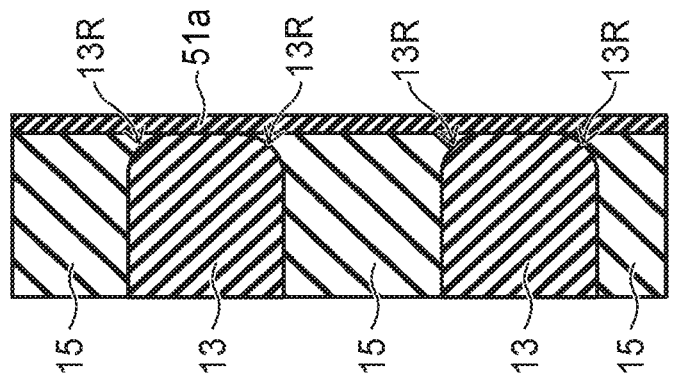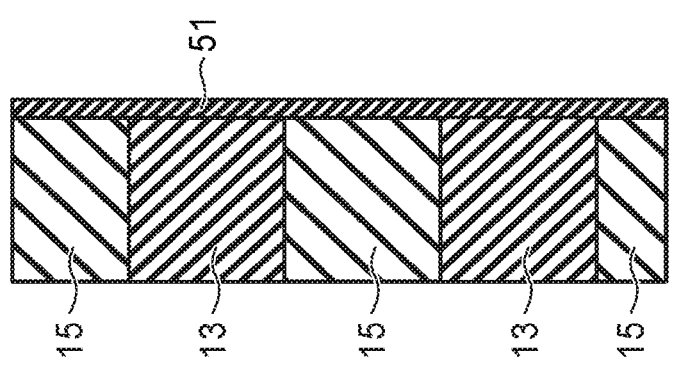

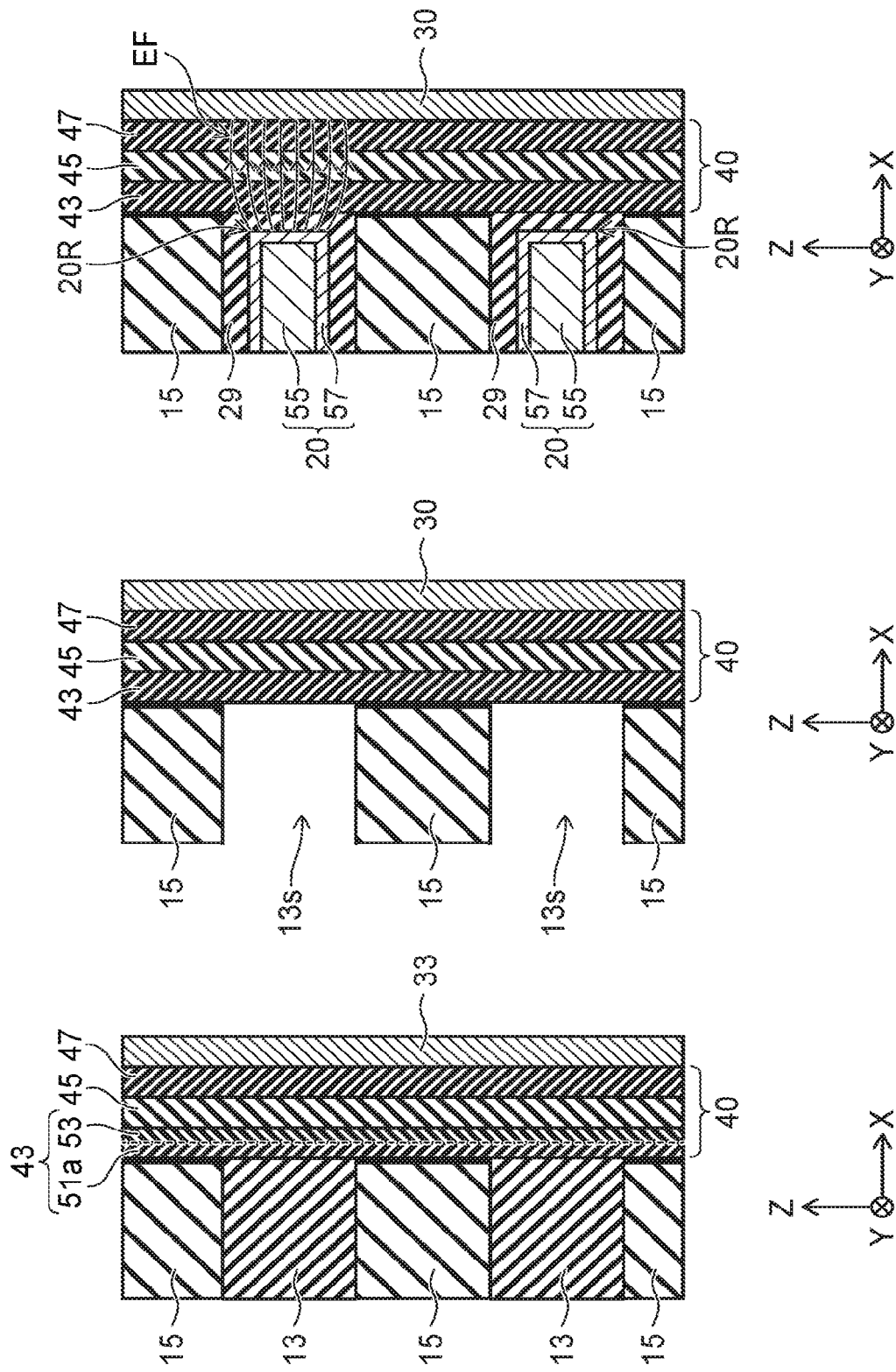

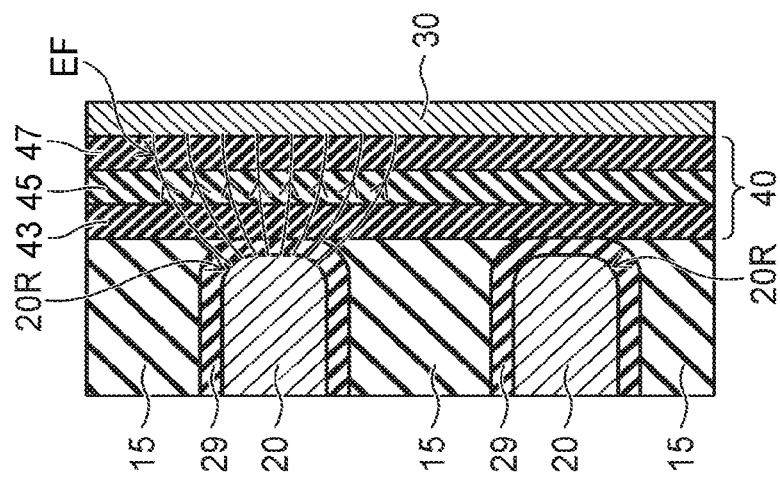
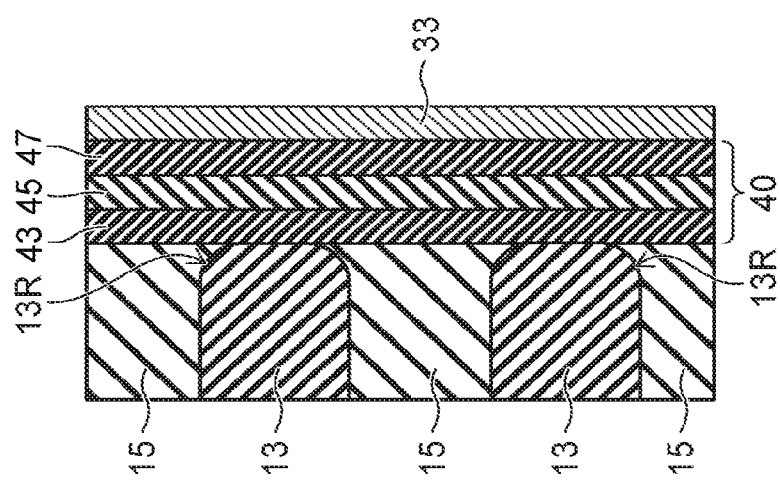

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/397,089 filed on Sep. 20, 2016; the entire contents of which are incorporated herein by reference.

FIELD

Embodiments are generally related to a semiconductor memory device and a method for manufacturing the same.

BACKGROUND

A semiconductor device is under developing, which includes three-dimensionally disposed memory cells. For example, in the NAND-type memory device, a semiconductor layer extends through a plurality of stacked electrode layers in the stacking direction, and memory cells are provided at parts respectively where the semiconductor layer intersects with the electrode layers. In such a memory device, there may be a case where the characteristic, for example, threshold voltage and like includes variations depending on a shape of lateral surfaces that face the semiconductor layer.

BRIEF DESCRIPTION OF THE DRAWINGS

FIGS. 5A to 5F are partial cross-sectional views schematically showing a forming process of a memory cell in the semiconductor memory device according to the first embodiment;

FIGS. 6A and 6B are partial cross-sectional views schematically showing a forming process of a memory cell in a semiconductor memory device according to a comparative example;

DETAILED DESCRIPTION

Figure 1:
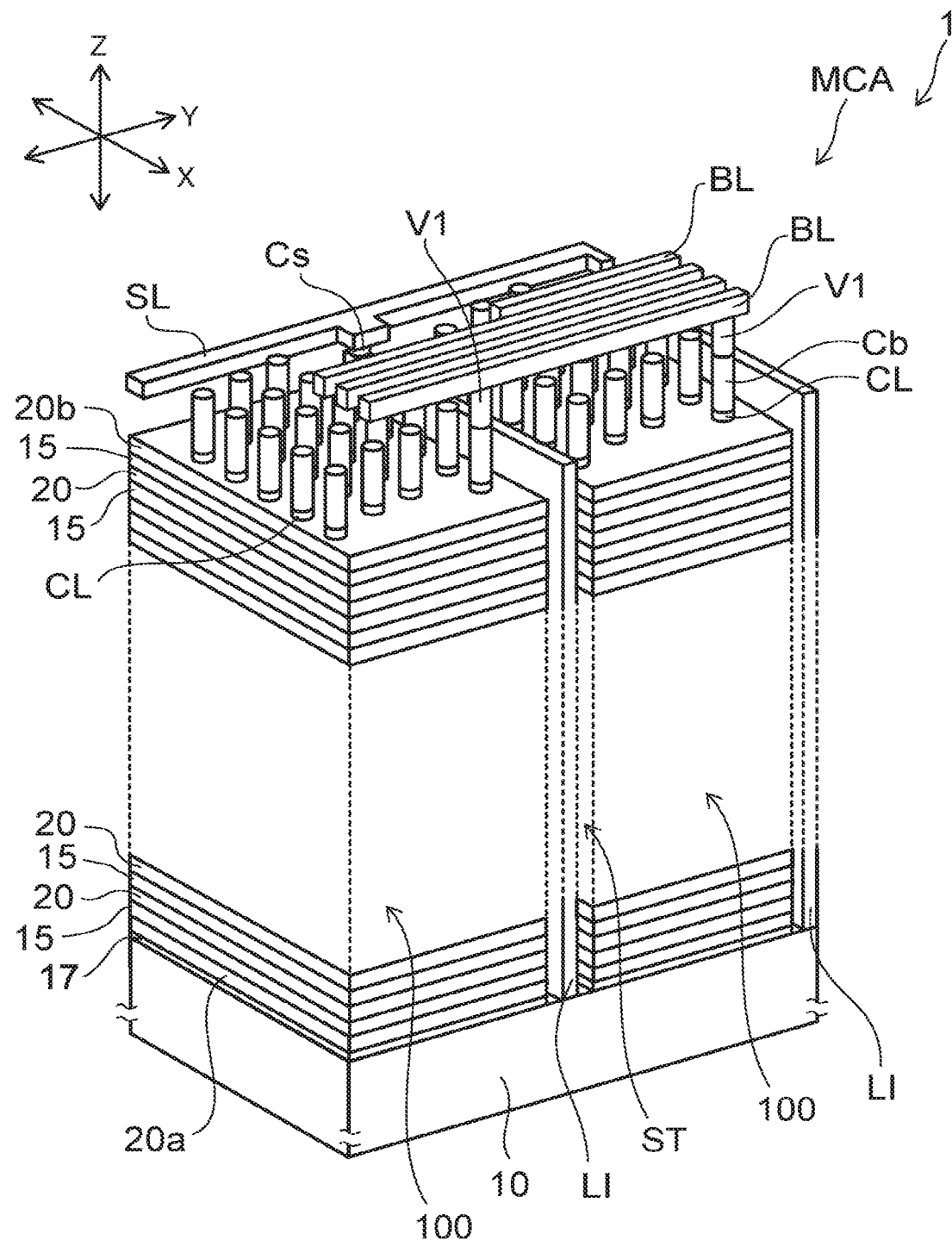
FIG. 1 is a perspective view schematically showing a semiconductor memory device according to a first embodiment.

According to one embodiment, a semiconductor memory device includes a first electrode layer; a second electrode layer provided above the first electrode layer; a first insulating oxide layer provided between the first electrode layer and the second electrode layer; a semiconductor layer extending through the first electrode layer, the first insulating oxide layer and the second electrode layer in a first direction, the first electrode layer, the first insulating oxide layer and the second electrode layer being stacked in the first direction; and a second insulating oxide layer extending in the first direction between the semiconductor layer and the first insulating oxide layer, the second insulating oxide layer being in contact with the first insulating oxide layer. At least one of the first insulating oxide layer and the second insulating oxide layer includes nitrogen atoms. The nitrogen atoms are distributed around an interface between the first insulating oxide layer and the second insulating oxide layer, or distributed in the vicinity of the interface.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a memory cell array MCA of a semiconductor memory device 1 according to a first embodiment. The semiconductor memory device 1 is, for example, a NAND-type memory device, which includes three-dimensionally disposed memory cells.

As shown in FIG. 1, the memory cell array MCA includes, for example, a conductive layer (hereinafter, a source layer 10) and a plurality of stacked bodies 100. The stacked bodies 100 are arranged in the Y-direction on the source layer 10. The stacked bodies 100 each include a plurality of electrode layers 20 stacked in the Z-direction on the source layer 10 and insulating layers 15 provided between the electrode layers 20 respectively. The insulating layers 15 electrically isolate the electrode layers 20 that are adjacent to each other in the Z-direction. An insulating layer 17 is provided between the source layer 10 and the electrode layer 20a that is the lowermost layer.

The source layer 10 is, for example, a P-type well provided in a silicon substrate (not shown). Alternatively, the source layer 10 may be a polycrystalline silicon layer provided on a silicon substrate via an interlayer insulating layer (not shown). The electrode layers 20 are, for example, metal layers including tungsten (W). The insulating layers 15 and 17 are insulating oxide layers, for example, silicon oxide layers.

Figure 2:
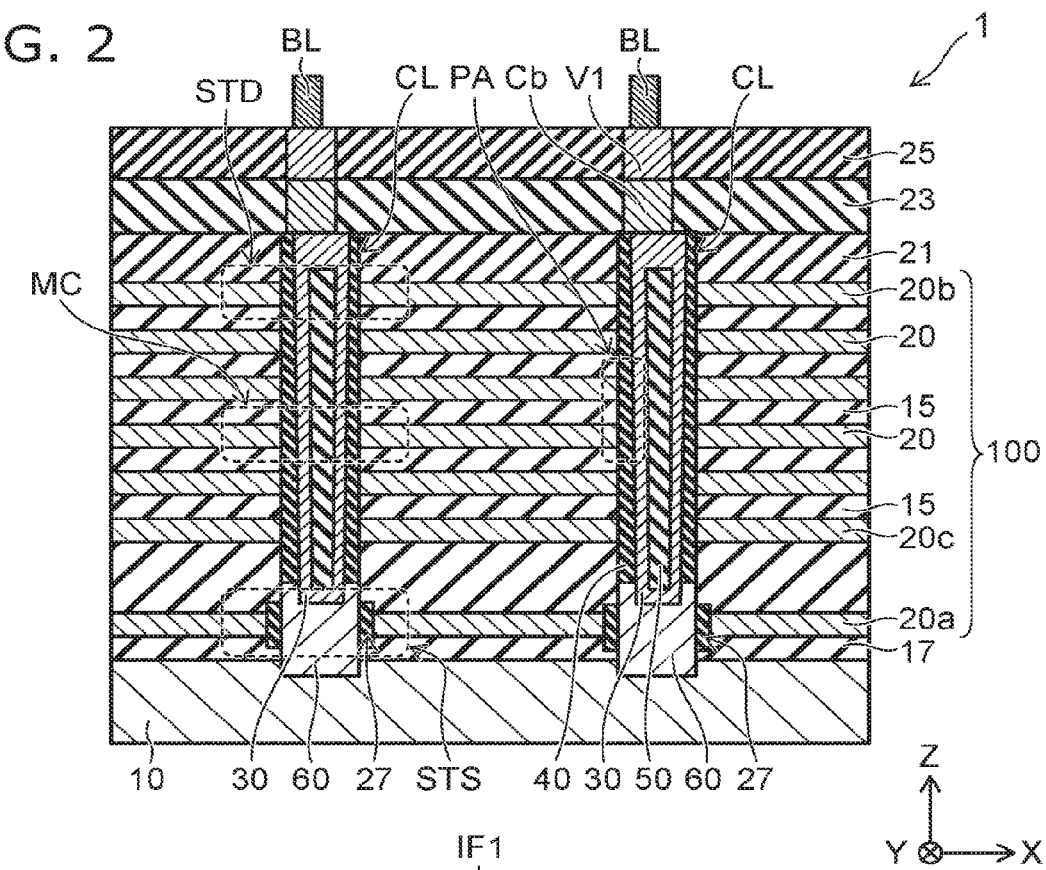
FIG. 2 is a schematic cross-sectional view showing the semiconductor memory device according to the first embodiment.

The stacked bodies 100 each include a plurality of columnar bodies CL extending in the Z-direction through the electrode layers 20 and insulating layers 15 (see FIG. 2). The columnar bodies CL are provided, for example, with a cylindrical shape. Alternatively, cross-sections of the columnar bodies CL taken along the X-Y plane may have, for example, a shape of ellipse or polygon. The columnar bodies CL each include a semiconductor layer 30 (see FIG. 2), and the semiconductor layer 30 is electrically connected to a bit line BL via contact plugs Cb and V1.

The bit line BL extends, for example, in the Y-direction above the stacked bodies 100. One of columnar bodies CL provided in each stacked body 100 shares one bit line BL. It should be noted that insulating layers 21, 23 and 25 (see FIG. 2), which are provided between the uppermost layer of the electrode layer 20, i.e. an electrode layer 20b and the bit line BL, are omitted in FIG. 1 for convenience in showing a structure of the semiconductor memory device 1.

As shown in FIG. 1, the semiconductor memory device 1 further includes source contact bodies LI and a source line SL. The source contact bodies LI are electrically connected to the source layer 10. The source line SL extends, for example, in the Y-direction above the stacked bodies 100. The source contact bodies LI electrically connects the source line 10 and the source line SL. The source contact bodies LI are provided, for example, in slit spaces ST respectively. The slit spaces ST separate the stacked bodies 100 from each other. The source contact bodies LI are, for example, plate shaped metal bodies extending in the X-direction and Z-direction. The source contact bodies LI are electrically connected to the source line SL through contact plugs Cs respectively.

FIG. 2 is a schematic view showing a partial cross-section of a stacked body 100 taken along the X-Z plane. Moreover, the number of the electrode layers 20 shown in FIG. 2 is less than that in FIG. 1 for convenience in illustrating the structure.

As shown in FIG. 2, the insulating layers 21, 23 and 25 are provided, for example, on the stacked body 100. The columnar bodies CL extend in the Z-direction through the electrode layers 20 and the insulating layers 15. The columnar bodies CL each include a semiconductor layer 30, an insulating layer 40 and a core body 50. The core body 50 is, for example, an insulating body including silicon oxide, and extends in the Z-direction. The insulating layer 40 is provided between the electrode layers 20 and the core body 50, and has a cylindrical shape surrounding the core body 50 and extending in the Z-direction along the core body 50. The semiconductor layer 30 is provided between the insulating layer 40 and the core body 50, and has a cylindrical shape surrounding the core body 50 and extending in the Z-direction.

In the embodiment, a semiconductor body 60 is further provided between the source layer 10 and a columnar body CL. The semiconductor layer 60 is, for example, a single crystalline silicon body epitaxially grown on the source layer 10 selectively.

The semiconductor layer 30 includes parts at a top end and a bottom end thereof respectively, which cover a top surface and a bottom surface of the core body 50. The semiconductor layer 30 is electrically connected at the top end thereof to a contact plug Cb. Moreover, the semiconductor layer 30 is electrically connected at the bottom end thereof to the semiconductor body 60.

The semiconductor body 60 is provided such as extending through the electrode layer 20a that is the lowermost layer of the electrode layers 20. A top end of the semiconductor body 60 is positioned at a level between the electrode layer 20a and an electrode layer 20c that is adjacent to the electrode layer 20a in the Z-direction. A bottom end of the semiconductor body 60 is positioned, for example, at a level lower than a surface of the source layer 10. An insulating layer is provided between the electrode layer 20a and the semiconductor body 60. The insulating layer 27 is, for example, a silicon oxide layer. The semiconductor body 60 is not limited to the example described above. For example, the semiconductor body 60 may be provided such as extending through the electrode layer 20a and the electrode layer 20c.

A top end of the columnar body CL extends through the insulating layer 21; and a contact plug Cb extends through the insulating layer 23. Moreover, a contact plug Cs (see FIG. 1) extends through the insulating layer 23 at a part not shown. That is, the source line SL shown in FIG. 1 is provided on the insulating layer 23, and is electrically connected to a source contact body LI through the contact plug Cs. Further, the insulating layer 25 is provided to cover the insulating layer 23 and the source line SL. Then, the bit line BL is provided on the insulating layer 25, and is electrically connected to the contact plug Cb through a contact plug V1 that extends through the insulating layer 25.

As shown in FIG. 2, memory cells MC and a selection transistor STD on a drain side are provided along the columnar body CL. The selection transistor STD is provided at a part where the columnar body CL extends through the electrode layer 20b that is the uppermost layer. The memory cells MC are provided at parts respectively, where the columnar body CL extends through the electrode layers 20 between the electrode layer 20a and the electrode layer 20b. Moreover, a selection transistor STS on a source side is provided at a part where the semiconductor body 60 extends through the electrode layer 20a.

As described above, the semiconductor memory device 1 includes a NAND string that includes a plurality of memory cells MC, the selection transistors STS and STD disposed along the semiconductor layer 30 extending in the Z-direction and along the semiconductor body 60.

The semiconductor layer 30 acts as a channel of the memory cells MC and the selection transistor STD. The electrode layers 20 positioned between the electrode layer 20a and the electrode layer 20b act as control gates of the memory cells MC. The electrode layer 20b acts as a selection gate SGD of the selection transistor STD.

The insulating layer 40 has a stacked structure (see FIG. 3), and acts, for example, as charge storage portions of the memory cells MC at parts positioned between the electrode layers 20 and the semiconductor layer 30.

The semiconductor body 60 acts as a channel of the selection transistor STS. The insulating layer 27 provided between the electrode layer 20a and the semiconductor body 60 acts as a gate insulating layer of the selection transistor STS. The electrode layer 20a acts as a selection gate SGS of the selection transistor STS.

Figure 3:
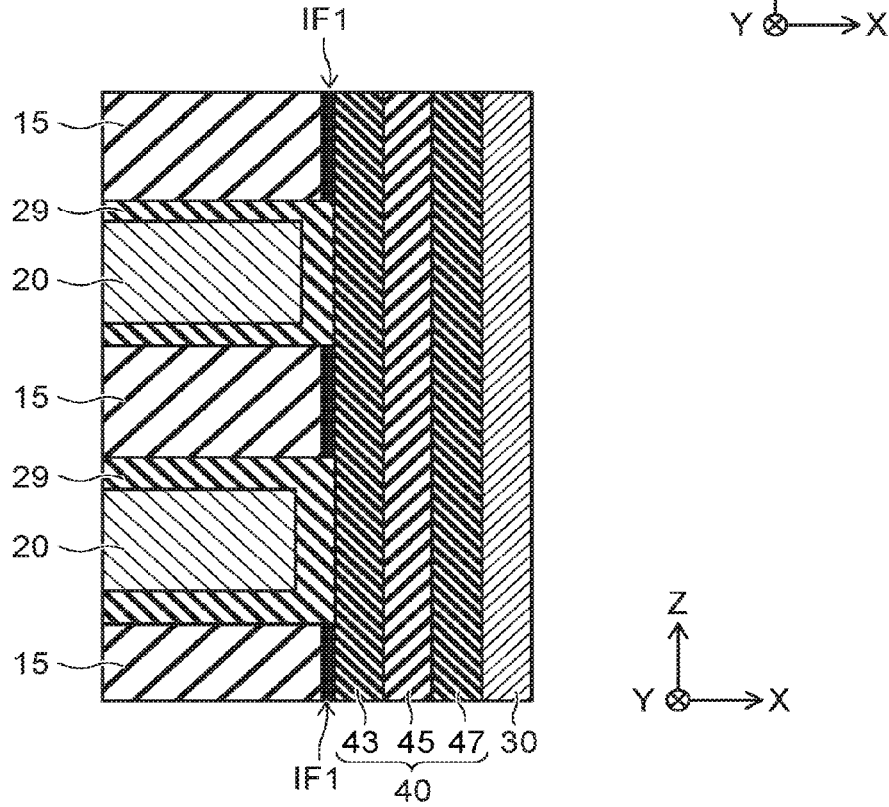
FIG. 3 is a partial cross-sectional view schematically showing the semiconductor memory device according to the first embodiment.

FIG. 3 is a partial cross-sectional view schematically showing memory cells MC of the semiconductor memory device 1 according to the first embodiment. FIG. 3 is the partial cross-sectional view showing an area PA that is indicated in FIG. 2.

As shown in FIG. 3, an insulating layer 29 is provided between an electrode layer 20 and an insulating layer 15 and between the electrode layer 20 and the insulating layer 40. The insulating layer 29 includes a high dielectric constant material such as aluminum oxide ($Al_2O_3$) and like.

The insulating layer 40 has a stacked structure that includes, for example, a first layer 43, a second layer 45 and a third layer 47. The insulating layer 40 has so-called the Oxide/Nitride/Oxide (ONO) structure, wherein the first layer 43 and the third layer 47 are silicon oxide layers, and the second layer 45 is a silicon nitride layer. The insulating layer 40 acts as a charge storage portion at a part between the electrode layer 20 and the semiconductor layer 30. That is, the insulating layer 29 and the first layer 43 act as a blocking insulator layer. The second layer 45 acts as a charge storage layer, and the third layer 47 acts as a tunnel insulator layer.

In the embodiment, an interface IF1 that contains nitrogen is further provided between the insulating layer 15 and the first layer 43 that being adjacent thereto. For example, the nitrogen distribution has a peak in the vicinity of the interface IF1.

Hereinafter, a manufacturing method of the semiconductor memory device 1 is described with reference to FIGS. 4A to 4J and FIGS. 5A to 5F. FIGS. 4A to 4J are schematic cross-sectional views showing a manufacturing process of the memory cell array in the semiconductor memory device 1. FIGS. 5A to 5F are partial cross-sectional views schematically showing a formation process of the memory cells.

Figure 4A:
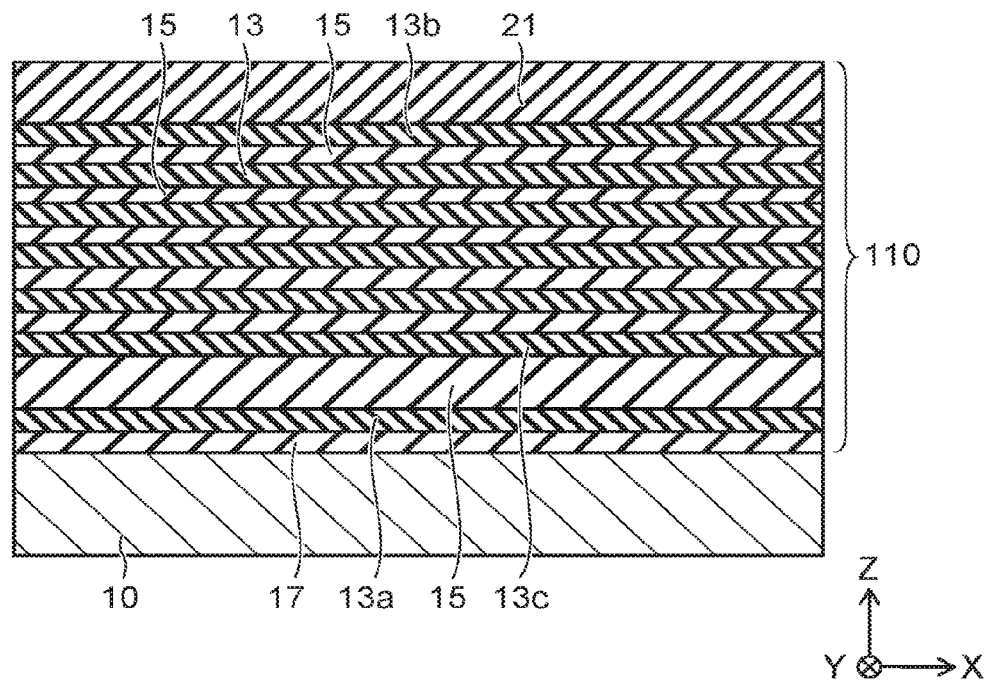
FIGS. 4A to 4J are schematic cross-sectional views showing a manufacturing process of the semiconductor memory device according to the first embodiment.

As shown in FIG. 4A, a stacked body 110 is formed on the source layer 10. The stacked body 110 includes a plurality of insulating layers 13, a plurality of insulating layers 15, insulating layers 17 and 21. The insulating layer 17 is formed on the source layer 10; and the insulating layers 13 and the insulating layers 15 are alternately stacked in the Z-direction on the insulating layer 17. The insulating layer 21 is formed on an insulating layer 13b that is the uppermost layer of the insulating layers 13. The insulating layers 15, 17 and 21 are, for example, silicon oxide layers. The insulating layers 13 are, for example, silicon nitride layers. The insulating layers 13, 15, 17 and 21 are formed, for example, using Chemical Vapor Deposition (CVD).

The insulating layers 13 are formed to have a thickness of about 30 nanometer (nm) respectively, for example, using source gases of monosilane ($SiH_4$) and ammonia ($NH_3$) at 300 to 700 degree Celsius under a circumstance of reduced pressure not more than 2000 Pascal (Pa). The insulating layers 15 are formed to have a thickness of about 30 nanometers (nm) respectively, for example, using source gas of tetraethyl orthosilicate (TEOS) at 300 to 700 degree Celsius under a circumstance of reduced pressure not more than 2000 Pa. It should be noted that an insulating layer 15 provided between the insulating layer 13a and the insulating layer 13c is formed to be thicker than other insulating layers 15 so that it is possible for a semiconductor body 60 described below (see FIG. 4C) to have a top surface positioned at a level between the insulating layer 13a and the insulating layer 13c.

Figure 4B:
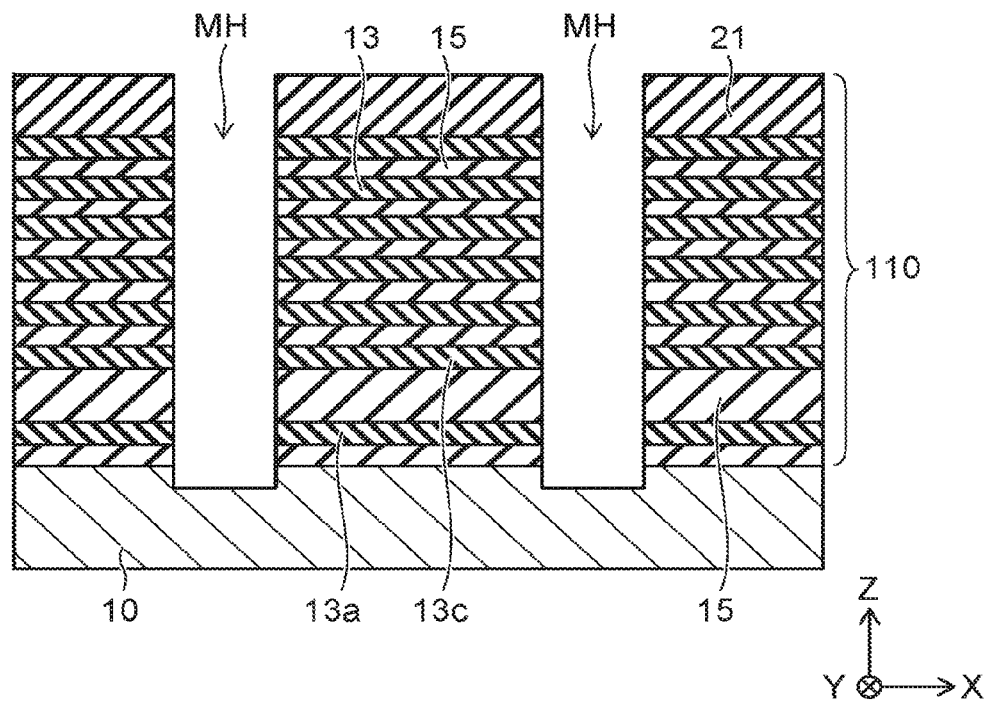

As shown in FIG. 4B, memory holes MH are formed to have a depth from the top surface of the stacked body 110 to the source layer 10. The memory holes MH are formed by selectively removing the insulating layers 13, 15, 17 and 21 using a polycrystalline silicon layer (not shown) as an etching mask and anisotropic RIE (Reactive Ion Etching). The source layer 10 is exposed at the bottoms of the memory holes MH. Then, the memory holes MH may be formed by selectively removing parts of the source layer 10 such that the bottom surfaces of the memory holes MH are positioned at a level lower than a top surface of the source layer 10.

Figure 4C:
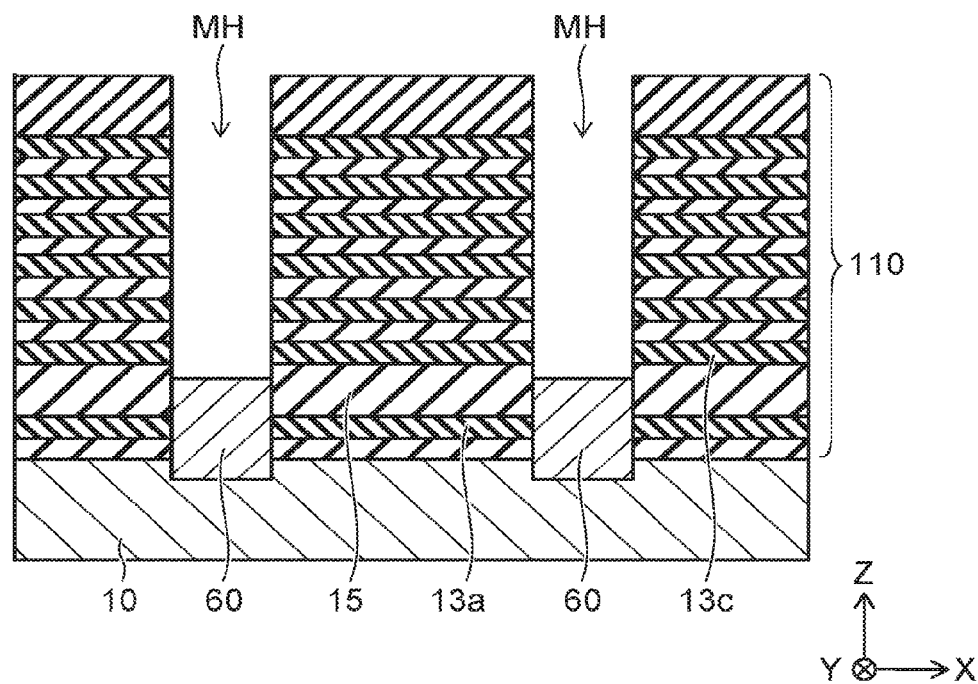

As shown in FIG. 4C, the semiconductor body 60 is formed at each bottom of the memory holes MH. The semiconductor body 60 is, for example, of single crystalline silicon epitaxially grown on the source layer 10. The semiconductor body 60 is formed to have the top surface thereof positioned at a level between the insulating layer 13a that is the lowermost layer of the insulating layers 13 stacked in the Z-direction and the insulating layer 13c that is adjacent to the insulating layer 13a in the Z-direction.

Figure 4D:
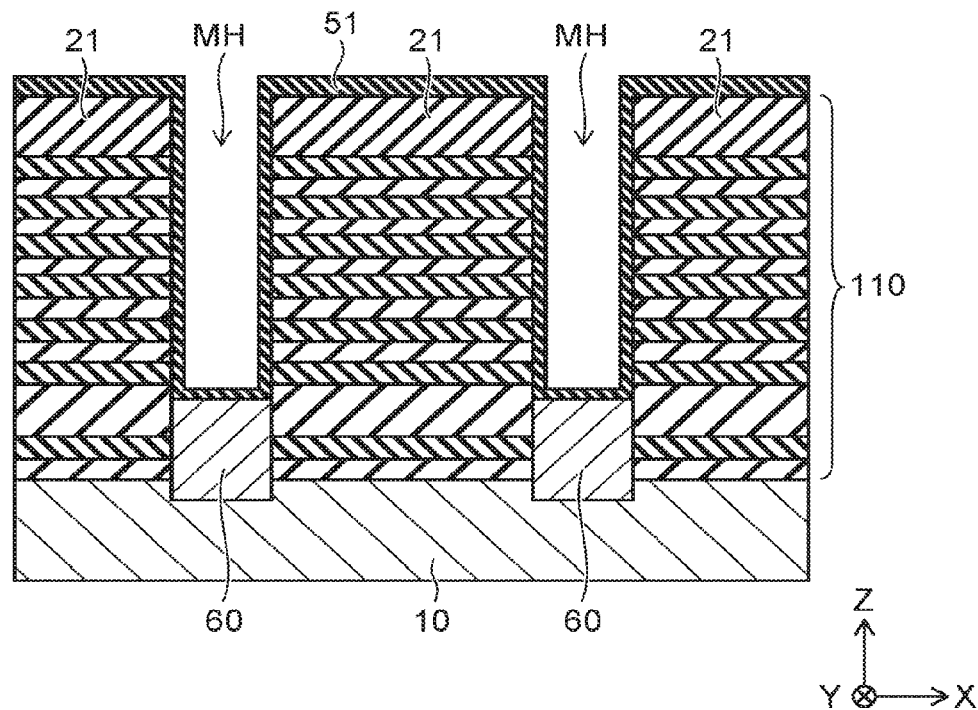

As shown in FIG. 4D, an insulating layer 51 is formed to cover inner surfaces of memory holes MH and the top surface of the stacked body 110. The insulating layer 51 is, for example, a silicon nitride layer formed using Atomic Layer Deposition (ALD). Subsequently, the insulating layer 51 is converted to an oxide layer by performing thermal oxidization. For example, the insulating layer 51 of the silicon nitride layer is converted to a silicon oxide layer. Furthermore, interfaces between the insulating layer 13 and the insulating layer 51 and between the insulating layer 15 and the insulating layer 51 are nitrided by performing a thermal treatment under atmosphere of nitric oxide (NO). This process will be described later in detail with reference to FIGS. 5A to 5C.

Figure 4E:
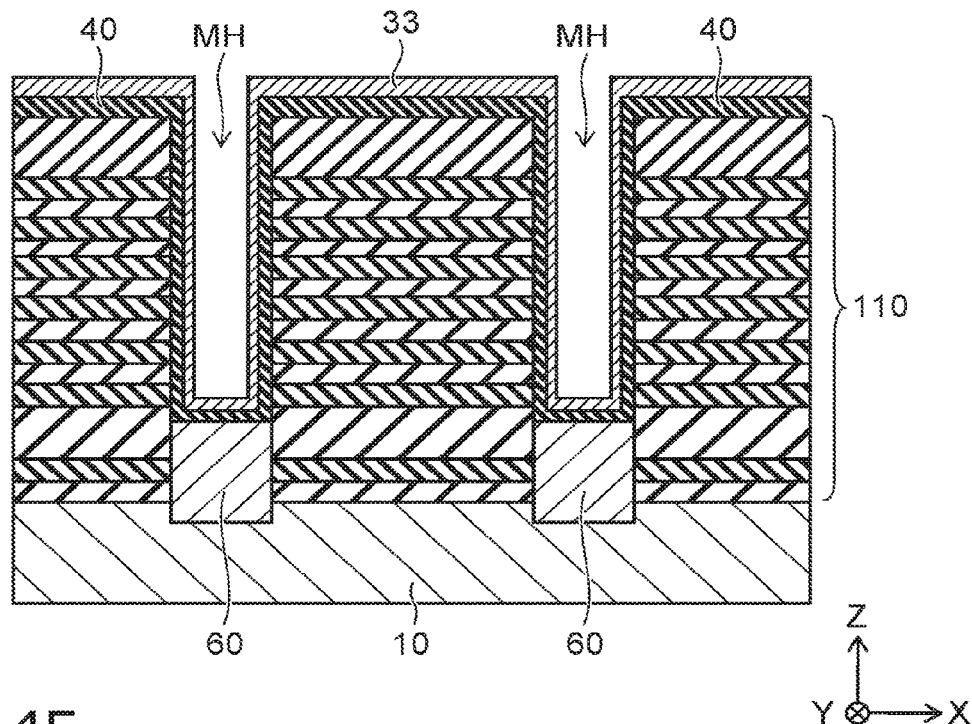

As shown in FIG. 4E, an insulating layer 40 and a semiconductor layer 33 are formed to cover the inner surfaces of the memory holes MH and the top surface of the stacked body 110. The insulating layer 40 has a stacked structure (see FIG. 5D) that includes the insulating layer 51.

Figure 4F:
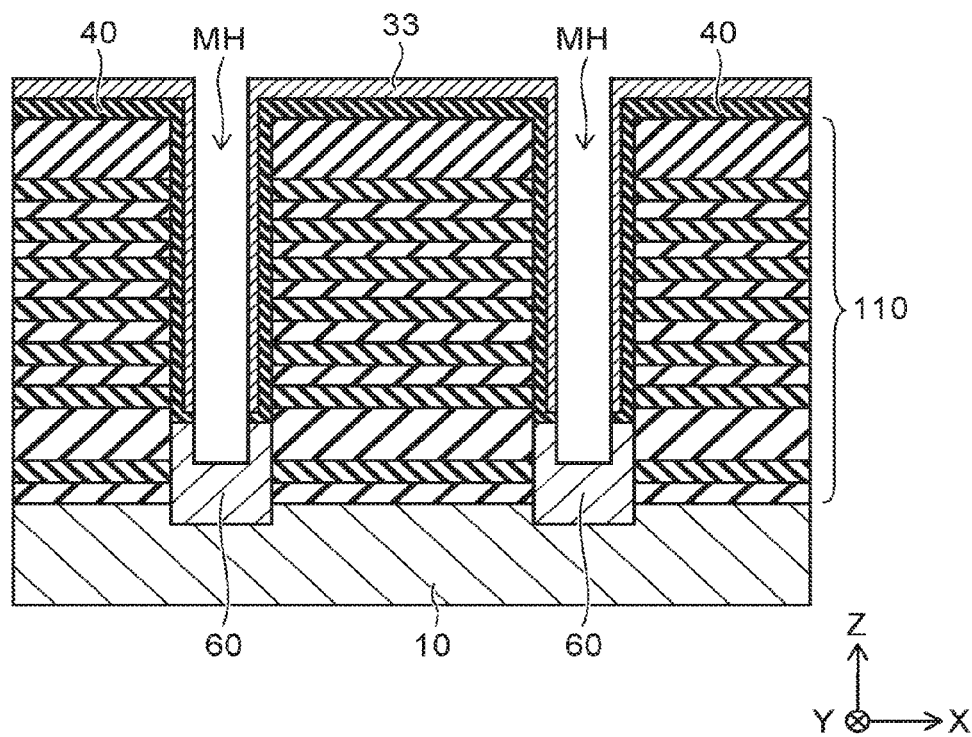

As shown in FIG. 4F, a part of the semiconductor layer 33 and a part of the insulating layer 40, which are formed on each bottom surface of the memory holes MH, are selectively removed, for example, using anisotropic RIE. Thus, the semiconductor body 60 is exposed at each bottom of the memory holes MH. The semiconductor layer 33 covers parts of the insulating layer 40 formed on the wall surfaces of the memory holes MH in order to reduce damages generated by the anisotropic RIE.

Figure 4G:
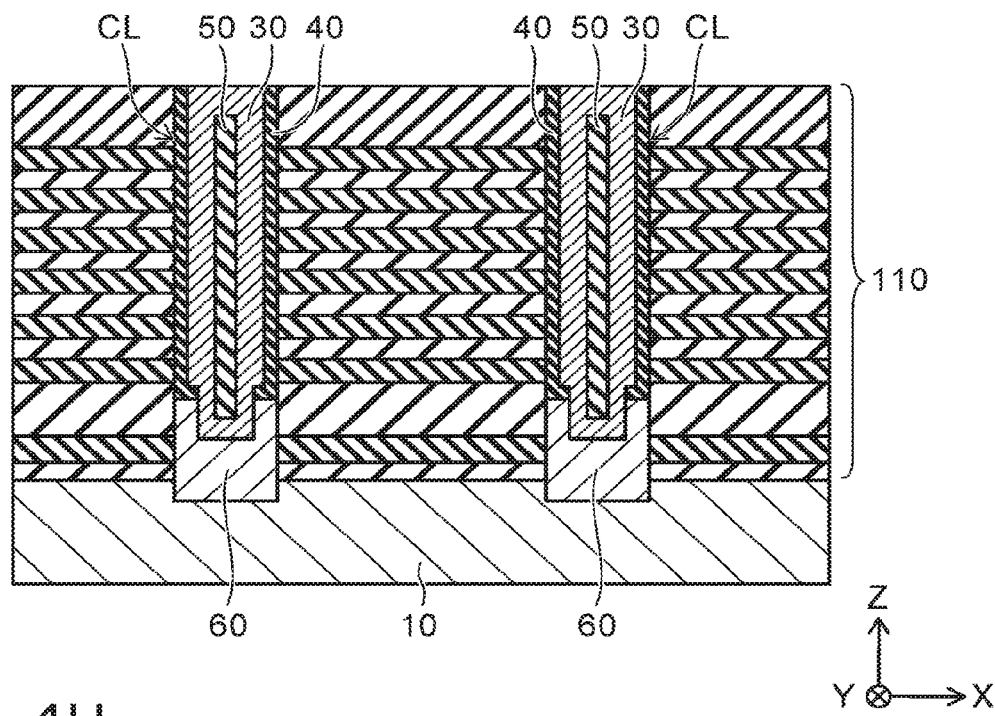

As shown in FIG. 4G, a semiconductor layer 30 and a core body 50 are formed in each memory hole MH to complete the columnar bodies CL. The semiconductor layer 30 includes the semiconductor layer 33, and is electrically connected to the semiconductor body 60 at a bottom end thereof. The core body 50 is formed to fill each inner space of the memory holes MH after the semiconductor layer 30 is formed. Moreover, a cap layer, which is a part of the semiconductor layer 30, is formed to fill a space on the core body 50.

Figure 4H:
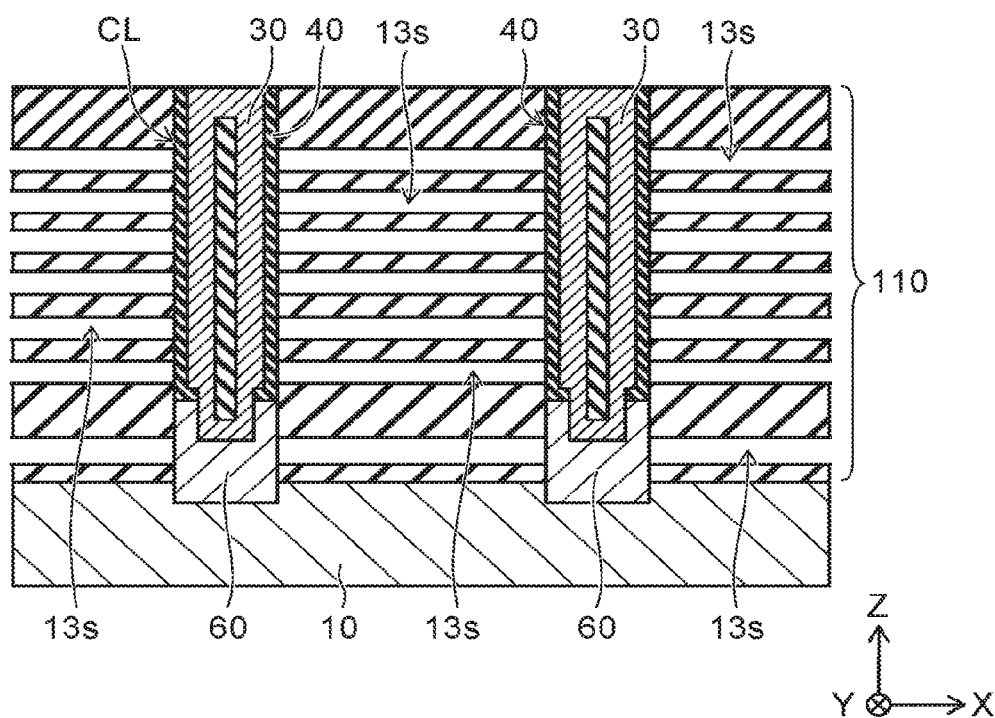

As shown in FIG. 4H, spaces 13s are formed in the stacked body 110 by selectively removing the insulating layers 13. For example, the insulating layers 13 are removed by supplying etching liquid through the slit spaces ST (see FIG. 1) which divide the stacked body 110. When the insulating layers 13 are silicon nitride layers, the insulating layers 13 can be selectively removed, for example, using hot phosphoric acid solution, leaving the insulating layer 15, which is an oxide layer, and the insulating layer 40.

Figure 4I:
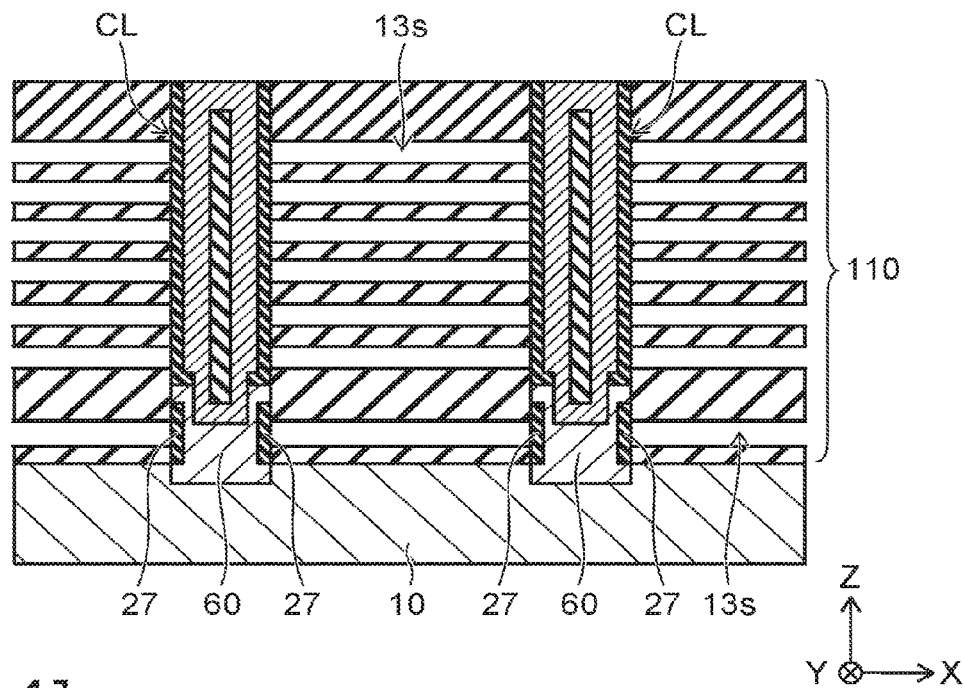

As shown in FIG. 4I, an insulating layer 27 is formed on a lateral surface of the semiconductor body 60 via a space 13s. The insulating layer 27 is selectively formed, for example, by thermally oxidizing the lateral surface of the semiconductor body 60.

Figure 4J:
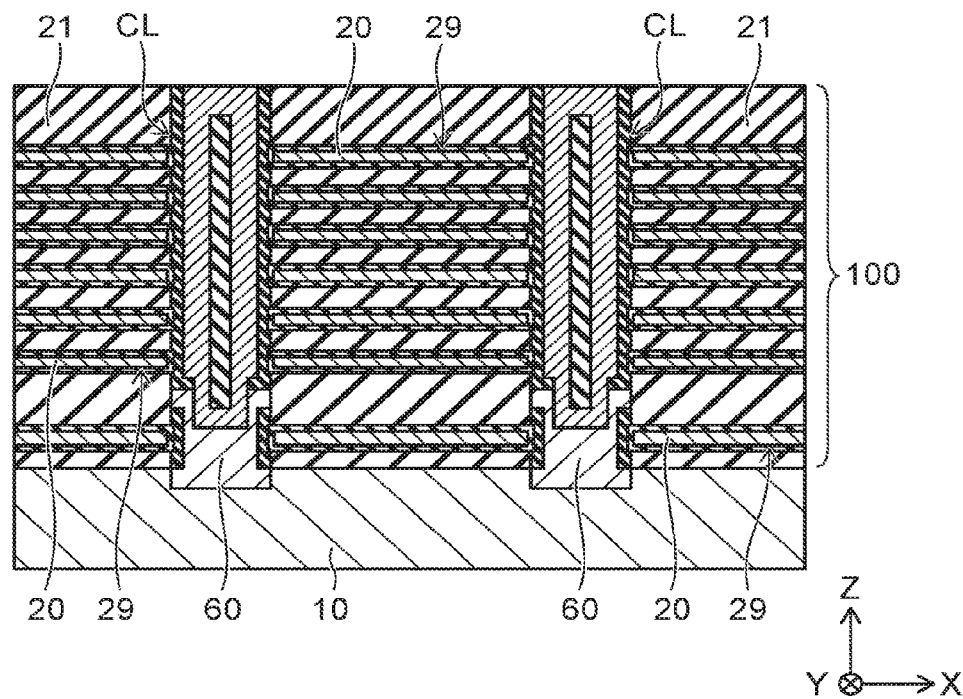

As shown in FIG. 4J, insulating layers 29 and electrode layers 20 are sequentially formed in the spaces 13s respectively, which are provided by removing the insulating layers 13 (see FIG. 4I), to complete the stacked body 100. The insulating layers 29 are, for example, high dielectric constant layer formed using ALD on inner surfaces of the spaces 13s. The electrode layers 20 are, for example, metal layers deposited using CVD, and formed to fill the spaces 13s respectively. The electrode layers 20 may have a stacked structure which includes, for example, a barrier metal (not shown) and a high-melting-point metal such as tungsten and like. The barrier metal is, for example, titanium nitride (TiN), and is formed between the insulating layer 29 and the high-melting-point metal.

Then, a source line SL is formed on the insulating layer 21 with the insulating layer 23 interposed, and a plurality of bit lines BL (see FIG. 1) are further formed via the insulating layer 25, thereby completing the memory cell array MCA of the semiconductor memory device 1.

FIGS. 5A to 5F are partial cross-sectional views schematically showing a process of forming the memory cells. FIGS. 5A to 5F are schematic cross-sectional views showing a part corresponding to the area PA indicated in FIG. 2.

As shown in FIG. 5A, an insulating layer 51 is formed on an inner surface of a memory hole MH (see FIG. 4D). The insulating layer 51 is, for example, a silicon nitride layer formed using ALD. The insulating layer 51 is formed to have a thickness of about 3 nm by alternately supplying dichlorosilane ($SiH_2Cl_2$) and ammonia ($NH_3$) at 300 to 700 degree Celsius under a circumstance of reduced pressure not more than 2000 Pa.

As shown in FIG. 5B, the insulating layer 51 is converted to the insulating layer 51a by the oxidization using ISSG (In situ Steam Generation). The insulating layer 51a is, for example, a silicon oxide layer formed by thermally oxidizing a silicon nitride layer, wherein hydrogen ($H_2$) and oxygen ($O_2$) are introduced at 900 to 1050 degree Celsius in a circumstance of reduced pressure not more than 2000 Pa.

Furthermore, the insulating layers 13, which are silicon nitride layers, are also oxidized in the thermally oxidization process described above. Thus, corner portions 13R each have a curvature radius enlarged. In other words, so-called "a bird's beak", which extends from the insulating layer 15, is formed at the interface between the insulating layer 13 and the insulating layer 51a. The bird's beak includes, for example, silicon oxynitride (SiON).

Then, a thermal treatment is performed at not less than 700 degree Celsius under nitric oxide (NO) atmosphere. In this process, nitrogen atoms, which are dissociated from nitric oxide (NO), are supplied through the insulating layer 51a to the interface between the insulating layer 13 and the insulating layer 51a. The thermal treatment in the NO atmosphere does not provide strong nitridation such as changing silicon oxide ($SiO_2$) to silicon nitride, but provides the nitridation at a degree of replacing an oxygen atom in silicon oxynitride with a nitrogen atom or making a connection with a dangling bond of silicon atom.

For example, the silicon oxynitride around the corner portion 13R is reconverted to silicon nitride by replacing oxygen atoms with nitrogen atoms. Thus, it is possible to make the bird's beak to be vanished and to make the curvature radius smaller as shown in FIG. 5C. Moreover, in the removing process of a resist film, which is performed after the memory holes MH are formed, silicon oxynitride is formed on the end surface of the insulating layer 13 by oxidization during ashing, for example. This silicon oxynitride is also reconverted to silicon nitride.

Furthermore, defects such as the dangling bond can be repaired at the interface IF1 between an insulating layer 15 and the insulating layer 51a. Thereby, nitrogen atoms locally distribute at the interface IF1 between the insulating layer 15 and the insulating layer 51a, and a peak of the distribution is positioned in the vicinity of the interface IF1.

As shown in FIG. 5D, an insulating layer 53 is formed on the insulating layer 51a, for example, using ALD. The insulating layer 51a and the insulating layer 53 configure the first layer 43 of the insulating layer 40. The insulating layer 53 is, for example, a silicon oxide layer. For example, the silicon oxide layer is formed to have a thickness of about 5 nm, for example, by supplying TDMAS (trisdimethylaminosilane) and ozone ($O_3$) at 300 to 700 degree Celsius under a circumstance of reduced pressure not more than 2000 Pa.

It should be noted that the heat treatment under the NO atmosphere described above may be preformed after the insulating layer 53 is formed. Moreover, the ISSG and the heat treatment under the NO atmosphere may be carried out after an insulating layer 51 is formed which has a thickness equal to the total thickness of the insulating layer 51a and the insulating layer 53. Thereby, it is possible to omit the formation of the insulating layer 53.

The second layer 45 and the third layer 47 are further formed on the first layer 43 (see FIG. 4E). The second layer 45 is, for example, a silicon nitride layer formed using ALD. The second layer 45 is formed to have a thickness of about 8 nm, for example, by alternately supplying $SiH_2Cl_2$ and $NH_3$ at 300 to 700 degree Celsius under a circumstance of reduced pressure not more than 2000 Pa. The third layer 47 is, for example, a silicon oxide layer formed using ALD. The third layer 47 is formed to have a thickness of about 7 nm, for example, by supplying TDMAS and $O_3$ at 400 to 800 degree Celsius under a circumstance of reduced pressure not more than 2000 Pa.

Then, a semiconductor layer 33 is formed on the insulating layer 40. The semiconductor layer 33 is, for example, a silicon layer formed using CVD. The silicon layer is deposited to have a thickness of about 10 nm, for example, by supplying monosilane at 400 to 800 degree Celsius under a circumstance of reduce pressure not more than about 2000 Pa.

A semiconductor layer 30 is further formed, with which the semiconductor 33 is combined (see FIG. 4G). The semiconductor layer 30 is of further depositing a silicon layer with a thickness of about 10 nm, for example, by supplying monosilane at 400 to 800 degree Celsius under a circumstance of reduced pressure no more than 2000 Pa.

Then, the insulating layers 13 are selectively removed as shown in FIG. 5E (see FIG. 4H). In the etching process for removing the insulating layers 13, the first layer 43 of the insulating layer 40 protects the second layer 45. That is, the first layer 43 is desired to have a resistance of high degree against the etching solution of the insulating layer 13.

Although ALD is preferably used to form a uniform insulating layer with a thin thickness such as the first layer 43, a silicon oxide layer formed using ALD, for example, has low resistivity against the etching solution of the insulating layer 13. So, a silicon nitride layer formed using ALD is converted to a silicon oxide layer by ISSG in the embodiment. Thereby, it is possible to achieve the first layer 43, which has the resistivity of high degree against the etching solution of the insulating layers 13.

As shown in FIG. 5F, the electrode layers 20 and the insulating layers 29 are formed in the spaces 13s respectively which are provided by removing the insulating layers 13 (see FIG. 43). Thus, the structure of the memory cell MC is completed, in which the insulating layer 40 is positioned between the electrode layers 20 and the semiconductor layer 30. The insulating layer 29 is, for example, an aluminum oxide layer ($AlO_x$) which is formed by ALD using TMA (trimethylaluminium) and $O_3$.

The electrode layers 20 each include a core metal layer 55 and a barrier metal layer 57. The core metal layer 55 is, for example, tungsten layer formed by CVD using tungsten hexafluoride ($WF_6$) and $SiH_4$ as source materials. The barrier metal layer 57 is, for example, titanium nitride layer, and is provided between the insulating layer 29 and the core metal layer 55. The barrier metal layer 57 is formed, for example, by CVD using titanium chloride (TiCl) and $NH_3$ as source materials.

FIGS. 6A and 6B are partial cross-sectional views schematically showing a process of forming memory cells according to a comparable example. FIGS. 6A and 6B are schematic cross-sectional views showing a part corresponding to area PA shown in FIG. 2.

As shown in FIG. 6A, the insulating layer 40 and the semiconductor layer 33 are formed in this example, leaving the bird's beak around each corner portion 13R of the insulating layers 13. That is, the heat treatment under the NO atmosphere is not performed after the insulating layer 51 is oxidized by ISSG.

Silicon oxynitride included in the bird's beak, for example, has a resistivity against the etching solution of the insulating layers 13. Thus, the bird's beak remains in an inner surface of each space 13s formed by removing the insulating layers 13. As a result, as shown in FIG. 6B, each electrode layer 20 has corner portions 20R that have large curvature radius.

In the memory cells MC having such a structure, an electric field induced by the voltage applied between an electrode layer 20 and the semiconductor layer 30 extends into insulating layers between the memory cells MC, and thus, may have a variation in the distribution thereof. That is, the threshold voltages of the memory cells MC may have variations respectively due to the variations of electric fringe fields which depend on a shape of the electrode layer 20 (i.e. the control gate).

As shown in FIG. 6B, electric force lines EF in the insulating layer 40 spread in the Z-direction. A distribution of the electric force lines EF depends on an edge shape of the electrode layer 20. For example, an electric flux density between the electrode layer 20 and the semiconductor layer 30 is reduced as the electric force lines spread in the Z-direction, and thus, the control gate may have less controllability in each of the memory cells MC. Thereby, it is necessary to apply the higher voltage between the electrode layer 20 and the semiconductor layer 30. Such a disadvantage may be more significant as the gate length, i.e. the thickness in the Z-direction of the electrode layer 20 is reduced, when the micro-miniaturization of memory cells MC will advance.

In contrast, in the memory cells MC according to the embodiment, it is possible to reduce the curvature radius at the corner portion of the electrode layer 20 as shown in FIG. 5F. Then, it is possible to reduce the variations of edge shape in the electrode layers 20. For example, the electric fringe field is reduced by suppressing the spread of electric force lines EF in the insulating layer 40. Reducing the curvature radius at the corner portion 20R also makes it possible to reduce the variations of gate length. Thereby, it is possible to improve uniformity of threshold voltage $V_{TH}$ in the memory cells MC. Moreover, it may be possible in the data writing operation to enhance a writing rate by reducing frequency of reads for verifying the threshold voltage $V_{TH}$.

Furthermore, electric field stress on the unselected memory cell is mitigated by reducing the frequency of verifying-reads. Also, it is possible to reduce the voltage applied between the electrode layer 20 and the semiconductor layer 30, since the controllability of control gate is improved by reducing the electric fringe field. Thus, the insulating layer 40 is possible to be prevented from deterioration due to the electric field, and the reliability of memory cells MC is improved.

The distribution of nitrogen atoms at the interface IF1 between the insulating layer 15 and the insulating layer 51a also depends on the qualities of insulating materials that form the insulating layers 15 and 51a. The distribution of nitrogen atoms includes a peak positioned in the insulating layer 15, for example, when the insulating layer 15 has a lower quality than a quality of the insulating layer 51a. For example, the silicon oxide layer formed using TEOS includes more dangling bonds than that in the silicon oxide layer formed by oxidizing silicon nitride layer. This makes the density of nitrogen higher in the insulating layer 15 than that in the insulating layer 51a, and thus, the electric fringe field is reduced in the memory cell MC. Thereby, the controllability is improved in the control gate of memory cell MC by suppressing leakage electric field between the memory cells MC. Thus, it is possible to improve the response of memory cell MC to the voltage applied between the electrode layer 20 and the semiconductor layer 30, thereby reducing the operation voltage.

In contrast to this, the distribution of nitrogen atoms has a peak in the insulating layer 51a, when the oxidization of the insulating layer 51 is insufficient, and the insulating layer 51a includes nitrogen atoms. That is, the nitrogen density in the insulating layer 51a is higher than that in the insulating layer 15. Thereby, parasitic capacitance is reduced between the electrode layers 20, and the threshold variations due to interference between the memory cells MC adjacent to each other are reduced.

The high dielectric constant layer, so called the high-k film is a metal oxide layer, which is used for the blocking insulator layer and includes many oxygen defects. Thereby, metal atoms may be easily diffused from the high dielectric constant layer. For example, it may be possible for metal atoms to be diffused along the interface IF1 between the insulating layer 15 and the insulating layer 40 from the insulating layer 29, which is the high dielectric constant layer, and thus, to be distributed between the memory cells MC. In the embodiment, it is possible to suppress the diffusion of metal atoms by the nitrogen atoms terminating the dangling bonds, which are distributed in the vicinity of the interface IF1. Thus, it is possible to suppress the leakage current via the metal atoms between the memory cells MC, for example.

FIGS. 7A to 7D are partial cross-sectional views schematically showing a process of forming the selection transistor STS of the semiconductor memory device 1. In FIGS. 7A to 7D, shown is a partial cross section of the stacked body 110 taken along the Y-Z plane, for example.

Figure 7A:
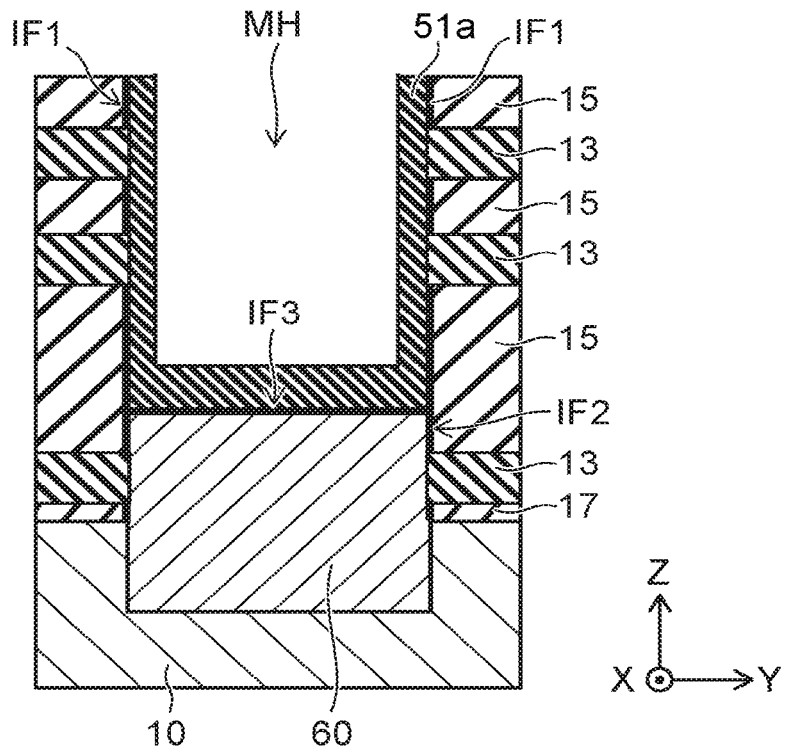
FIGS. 7A to 7D are partial cross-sectional view schematically showing a forming process of a selection transistor in the semiconductor memory device according to the first embodiment.

In FIG. 7A, the insulating layer 51a is shown, which is formed on the semiconductor body 60 at the bottom of the memory hole MH. The insulating layer 51a, which is oxidized using ISSG, is thermally treated in the NO atmosphere. Thereby, nitrogen atoms are localized in the vicinity of the interface IF1 between the insulating layers 15 and the insulating layer 51a (see FIG. 5C).

Furthermore, nitrogen atoms dissociated from NO are bonded, for example, to dangling bonds of silicon atoms at an interface IF2 between an insulating layer 15 and the semiconductor body 60 and at an interface IF3 between the insulating layer 51a and the semiconductor body 60, and remain in each interface. That is, there are portions, in which nitrogen atoms are also localized, at the interface IF2 between the insulating layer 15 and the semiconductor body 60 and at the interface IF3 between the insulating layer 51a and the semiconductor body 60.

Figure 7B:
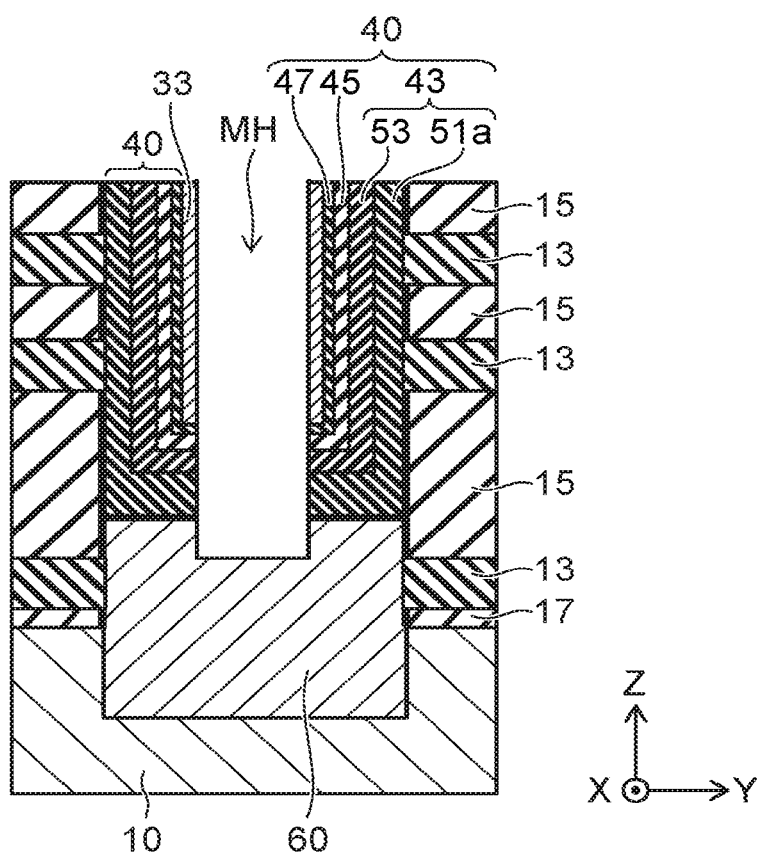

As shown in FIG. 7B, the insulating layer 40 and the semiconductor layer 33 are formed on the inner surface of the memory hole MH, and then, parts of the insulating layer 40 and the semiconductor layer 33 are selectively removed, which are formed on the bottom surface of the memory hole MH (see FIGS. 4E and 4F).

Figure 7C:
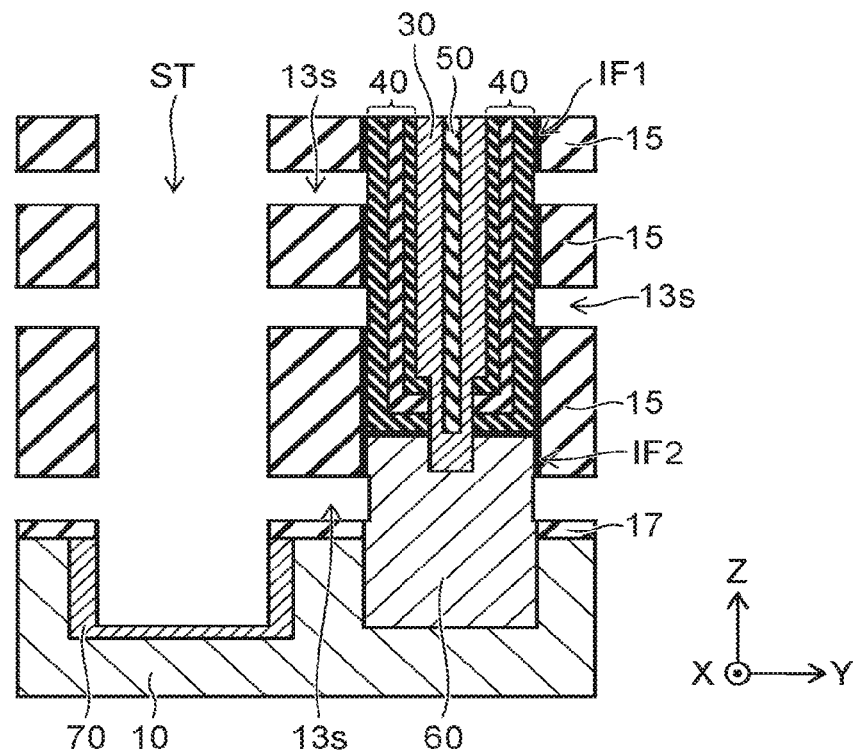

Subsequently, as shown in FIG. 7C, the insulating layers 13 are selectively removed after the semiconductor layer 30 and the core body 50 are formed in the memory hole MH (see FIG. 4H). The insulating layers 13 are selectively etched by supplying the etching solution through the slit spaces ST shown in FIG. 7C.

Figure 7D:
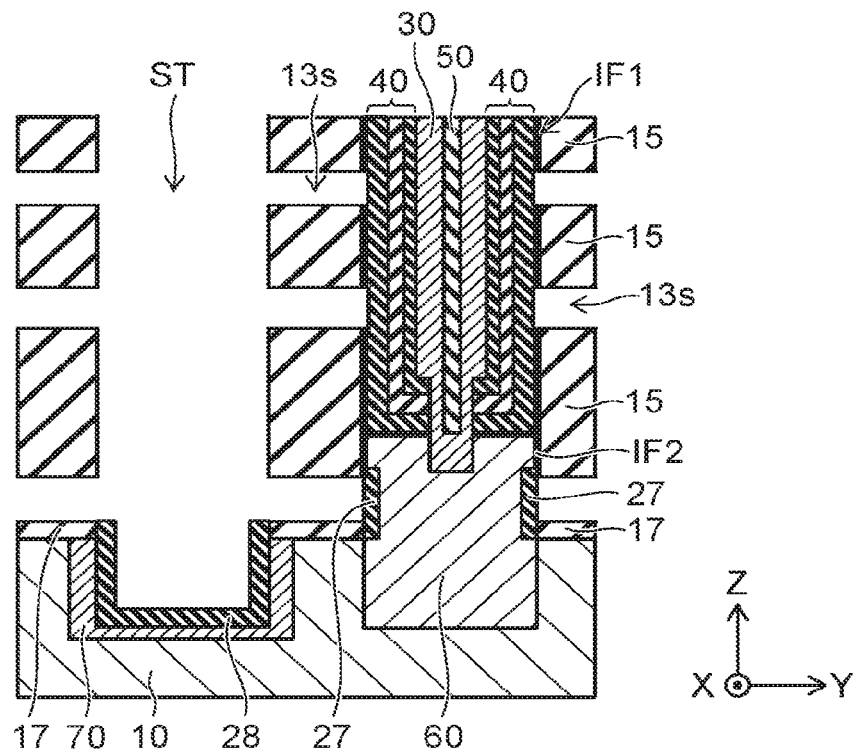

As shown in FIG. 7D, the insulating layer 27 is formed by thermally oxidizing the lateral surface of the semiconductor body 60 via the space 13s that is formed by removing the insulating layer 13. The insulating layer 27 is formed to have a thickness of about 20 nm, for example, by the oxidization using Water Vapor Generator (WVG). During this oxidation process, an insulating layer 28 is also formed on a bottom surface of the memory hole MH, and a layer thickness of the insulating layer 17 becomes thicker. It should be noted that an impurity diffused layer 70 is formed before the insulating layers 13 are removed through the slit spaces ST (see FIG. 7C).

Then, the nitrogen atoms localized at the interface IF2 between the insulating layer 15 and the semiconductor body 60 suppress the oxidization progressing along the interface IF2. Thereby, it is possible at the interface IF2 to suppress the formation of bird's beak, which is made of silicon oxide, and to form the insulating layer 27 within a prescribed area.

As a result, uniform electric field may be induced between the electrode layer 20a (i.e. the selection gate SGS) and the semiconductor body 60, thereby suppressing variations of threshold voltages $V_{TH}$ in the selection transistors STS. Moreover, it is possible to suppress the raise of resistance between the semiconductor layer 30 and the semiconductor body 60 due to narrowing of a width in the top portion of the semiconductor body 60, thereby suppressing variations of cell currents. It is also possible to avoid deterioration by stress, since isolation breakdown is suppressed at a portion where the bird's beak would be formed. Furthermore, the nitrogen atoms distributed at the interface IF2 between the insulating layer 15 and the semiconductor body 60 and at the interface IF3 between the insulating layer 51a and the semiconductor body 60 reduce the interface traps by terminating the dangling bonds, and make an inversion layer easily extended in the selection transistor STS. Thereby, it is possible to reduce the threshold voltage of the selection transistor STS. It is also possible to enlarge the ON current when reading data out.

Figure 8:
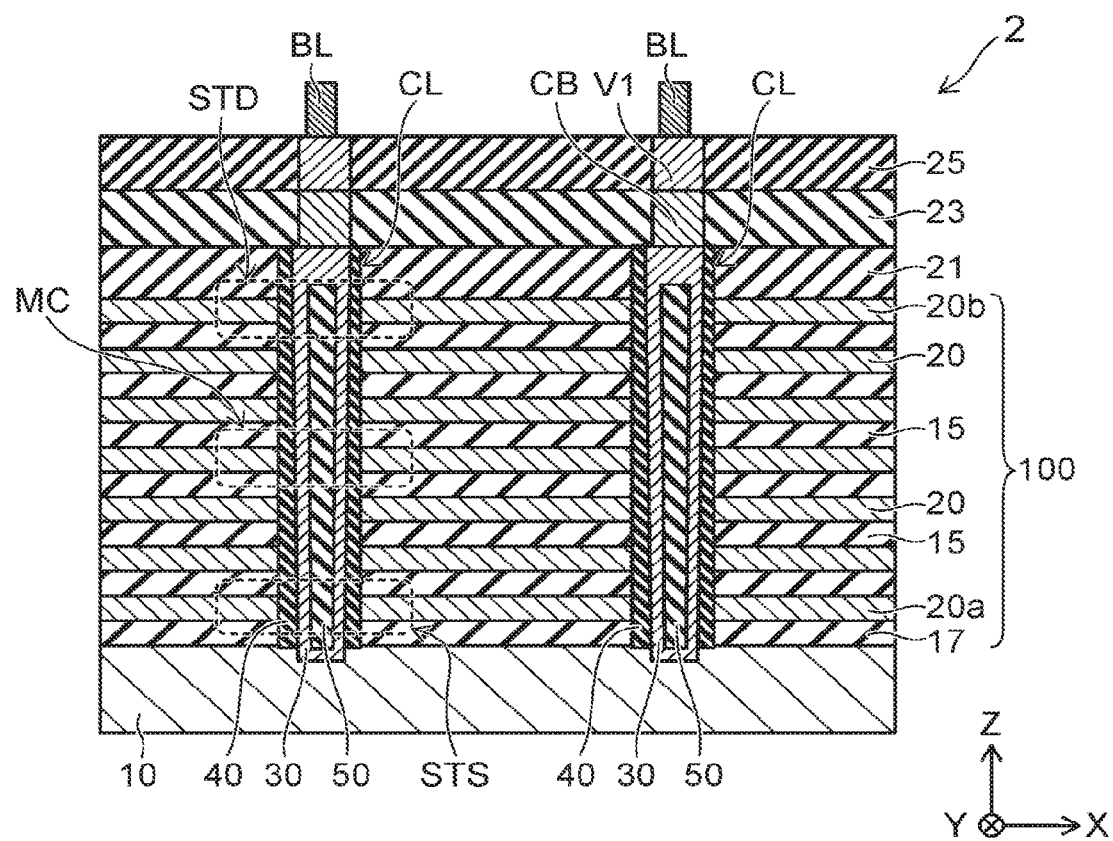
FIG. 8 is a schematic cross-sectional view showing a semiconductor memory device according to a second embodiment.

FIG. 8 is a schematic cross-sectional view showing a memory cell array in a semiconductor memory device 2 according to a second embodiment. In this example, the semiconductor body 60 is not provided, and the semiconductor layer 30 is connected to the source layer 10. The columnar bodies CL extends in the Z-direction through a plurality of electrode layers 20 that includes the electrode layer 20a.

In the embodiment, the memory cells are also formed according to the process showing FIGS. 5A to 5F. That is, the corner portions 20R in the end surfaces of the electrode layers 20 facing a columnar body CL are formed to have the small radius of curvature. Thereby, it is possible in the memory cells MC to improve controllability of control gates, and to suppress the variations of threshold voltages, thus improving the reliability of the memory cells MC.

As described above, the first embodiment and the second embodiment are explained, but the embodiment is not limited thereto. Although the heat treatment in the NO atmosphere is explained as an example, $NH_3$ may be included in atmosphere, for example, not limiting to NO. Alternatively, it may be possible to use nitrogen radicals supplied by dissociating NO, $NH_3$, $N_2$ and like in plasma or to use plasma nitridation. A gas in the atmosphere is not specifically limited in the embodiment. Furthermore, it may be possible to perform thermally annealing at low temperature such as 500 to 900 degree Celsius for long time, or at higher temperature such as not less than 900 degree Celsius for short time.

In the embodiments described above, the nitridation is mainly performed at the interface between layers, for example, not providing a SiN layer between the layers. A density of nitrogen atoms at the interface is, for example, not more than $1 \times 10^{15}$ atoms/cm$^2$. The bonding states of nitrogen atoms at the interface can be detected, for example, using X-ray Photoelectron Spectroscopy (XPS).

The insulating layers 13 and 15 may be formed, for example, using Plasma-enhanced Chemical Vapor Deposition (P-CVD), in which silicon nitride is deposited using $SiH_2Cl_2$ and $NH_3$, and silicon oxide is deposited using $SiH_4$ and $N_2O$. The electrode layers 20 may be formed of a material except for tungsten, for example, polycrystalline silicon with low resistivity or silicide. The first layer 43 of the insulating layer 40 may be so-called a high-k film such as $AlO_x$, $HfO_x$, $LaAlO_x$ and like, or may have a stacked structure of the high-k film and silicon oxide. The third layer 47 may also be the high-k film described above as well.

The semiconductor layer 30 is not limited to the silicon layer formed by CVD using SiH4 as the source material, and may be a silicon layer formed using other gas such as $Si_2H_6$. Alternatively, in the formation of the semiconductor layer 30, a silicon layer may be formed as a seed layer using $Si_2H_6$ as a source material, and then, another silicon layer is formed thereon using $SiH_4$ as a source material. The semiconductor body 60 may also be formed with the same method as the semiconductor layer 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, the device comprising:
    a first electrode layer;
    a second electrode layer provided above the first electrode layer;
    a first insulating oxide layer provided between the first electrode layer and the second electrode layer;
    a semiconductor layer extending through the first electrode layer, the first insulating oxide layer and the second electrode layer in a first direction, the first electrode layer, the first insulating oxide layer and the second electrode layer being stacked in the first direction; and
    a second insulating oxide layer extending in the first direction between the semiconductor layer and the first insulating oxide layer, the second insulating oxide layer being in contact with the first insulating oxide layer,
    at least one of the first insulating oxide layer and the second insulating oxide layer including nitrogen atoms, the nitrogen atoms being distributed around an interface between the first insulating oxide layer and the second insulating oxide layer, or being distributed in the vicinity of the interface.

2. The device according to claim 1, wherein
a concentration of nitrogen atoms in the first insulating oxide layer is higher than a concentration of nitrogen atoms in the second insulating oxide layer.

3. The device according to claim 1, wherein
the first insulating oxide layer and the second insulating oxide layer are silicon oxide layers.

4. The device according to claim 1, further comprising:
a first insulating layer provided between the semiconductor layer and the second insulating oxide layer; and
a second insulating layer provided between the semiconductor layer and the first insulating layer.

5. The device according to claim 1, further comprising:
a third insulating layer provided between the second insulating oxide layer and each of the first electrode layer and the second electrode layer, the third insulating layer having a relative dielectric constant larger than a relative dielectric constant of the second insulating oxide layer.

6. The device according to claim 5, wherein
the third insulating layer extends between the first electrode layer and the first insulating oxide layer, and between the second electrode layer and the first insulating oxide layer.

7. The device according to claim 5, wherein
the third insulating layer is in contact with the second insulating oxide layer.

8. The device according to claim 1, wherein
the second insulating oxide layer includes a first layer and a second layer, the first layer being in contact with the first insulating oxide layer and including nitrogen atoms, and the second layer being provided between the first layer and the semiconductor layer.

9. A semiconductor memory device, the device comprising:
a source layer;
a first word line provided above the source layer;
a selection gate provided between the source layer and the first word line;
a first semiconductor channel body extending through the first word line;
a second semiconductor channel body extending through the selection gate, and connected to the first semiconductor channel body and the source layer; and
a first interlayer insulating layer provided between the selection gate and the first word line, and including a first insulating oxide,
the second semiconductor channel body extending through at least a part of the first interlayer insulating layer, and being in contact with the at least a part of the first interlayer insulating layer,
at least one of the at least a part of the first interlayer insulating layer and the second semiconductor channel body including first nitrogen atoms, the first nitrogen atoms being distributed around an interface between the first interlayer insulating layer and the second semiconductor channel body, or being distributed in the vicinity of the interface.

10. The device according to claim 9, wherein the first insulating oxide is silicon oxide.

11. The device according to claim 9, further comprising:
a blocking insulator layer positioned between the first semiconductor channel body and the first word line, and including a second insulating oxide;
a second word line provided above the first word line; and
a second interlayer insulating layer provided between the first word line and the second word line, and including a third insulating oxide,
the first semiconductor channel body extending through the first word line, the second interlayer insulating layer and the second word line,
the blocking insulator layer extending along the first semiconductor channel body between the first semiconductor channel body and the second interlayer insulating layer, and being in contact with the second interlayer insulating layer, and
at least one of the second interlayer insulating layer and the blocking insulator layer including second nitrogen atoms, the second nitrogen atoms being distributed around an interface between the second interlayer insulating layer and the blocking insulator layer, or being distributed in the vicinity of the interface.

12. The device according to claim 11, wherein
a concentration of nitrogen atoms in the second interlayer insulating layer is higher than a concentration of nitrogen atoms in the blocking insulator layer.

13. The device according to claim 11, wherein
the first insulating oxide, the second insulating oxide and the third insulating oxide are silicon oxide.

14. The device according to claim 11, wherein
the first interlayer insulating layer is in contact with a part of the blocking insulator layer that is positioned at a level between the selection gate and the first word line, and
at least one of the first interlayer insulating layer and the part of the blocking insulator layer includes third nitrogen atoms, the third nitrogen atoms being distributed around an interface between the first interlayer insulating layer and the blocking insulator layer, or being distributed in the vicinity of the interface.

15. The device according to claim 14, wherein
a concentration of nitrogen atoms in the first interlayer insulating layer is higher than a concentration of the third nitrogen atoms in the blocking insulator layer.

16. The device according to claim 11, wherein
the blocking insulator layer includes a part being in contact with the second semiconductor channel body at a level, the first semiconductor channel body being connected at the level to the second semiconductor channel body, and
at least one of the second semiconductor channel body or the part of the blocking insulator layer includes fourth nitrogen atoms, the fourth nitrogen atoms being distributed around an interface between the second semiconductor channel body and the blocking insulator layer, or being distributed in the vicinity of the interface.

17. The device according to claim 11, further comprising:
a charge storage layer provided between the first semiconductor channel body and the blocking insulator layer, and
a tunnel insulator layer provided between the first semiconductor channel body and the charge storage layer.

18. The device according to claim 11, wherein
the blocking insulator layer includes a first layer and a second layer, the first layer being in contact with the second interlayer insulating layer and including the second nitrogen atoms, and the second layer being positioned between the first layer and the first semiconductor channel body.

* * * * *